United States Patent [19]
Hong et al.

[11] Patent Number: 5,897,752
[45] Date of Patent: Apr. 27, 1999

[54] WAFER BIAS RING IN A SUSTAINED SELF-SPUTTERING REACTOR

[75] Inventors: Liubo Hong, San Jose; John Forster, San Francisco; Jianming Fu, San Jose, all of Calif.

[73] Assignee: Applied Materials, Inc., Santa Clara, Calif.

[21] Appl. No.: 08/859,300

[22] Filed: May 20, 1997

[51] Int. Cl.$^6$ .................................................. C23C 14/34
[52] U.S. Cl. ............................... 204/192.12; 204/192.15; 204/298.06; 204/298.08; 204/298.11; 204/298.14; 204/298.15; 204/298.19; 204/298.2
[58] Field of Search ................... 204/298.06, 298.08, 204/298.11, 298.14, 298.15, 298.16, 298.17, 298.18, 298.19, 192.12, 192.15, 192.17, 192.3, 298.2

[56] References Cited

U.S. PATENT DOCUMENTS

| | | | |
|---|---|---|---|
| 3,410,775 | 11/1968 | Vratny | 204/298.06 |
| 4,038,171 | 7/1977 | Moss et al. | 204/298.06 |
| 5,114,556 | 5/1992 | Lamont, Jr. | 204/298.06 |
| 5,202,008 | 4/1993 | Talieh et al. | 204/298.11 |
| 5,316,645 | 5/1994 | Yamagami et al. | 204/298.06 |
| 5,316,646 | 5/1994 | Yamagami et al. | 204/298.06 |

FOREIGN PATENT DOCUMENTS 0 703 598 A1   3/1996   European Pat. Off. .

OTHER PUBLICATIONS

Murarka et al., "Copper metallization for ULSI and beyond," *Critical Reviews in Solid State and Materials Science*, vol. 10, No. 2, 1995, pp. 87–124.
Posadowski et al., "Sustained self–sputtering using a direct current magnetron source," *Journal of Vaccuum Science and Technology*, vol. 11, No. 6, 1993, pp. 2980–2984.
Asamaki et al., "Copper self–sputtering by planar magnetron," *Japanese Journal of Applied Physics*, vol. 33, pt. 1, No. 8, 1994, pp. 2500–2503.
Asamaki et al., "Filing of sub–$\mu$m holes by self–spitter deposition," *Japanese Journal of Applied Physics*, vol. 33, pt. 1, No 8, 1994, pp. 4566–4569.
Posadowski et al., "Sustained self–sputtering using a direct current magnetron source," Journal of Vacuum Science and Technology, vol. 11, No. 6, 1993, pp. 2980–2984, Nov. 1993.
Asamaki et al., "Copper self–sputtergn by planar magnetron", Japanese Journal of Applied physics, vol. 33, pt. 1, No. 8, 1994, pp. 2500–2503, May 1994.
Posadowski et al., "Sustained self–sputtering using a direct current magnetron source," Journal of Vacuum Science and Technology, vol. 11, No. 6, 1993, pp. 2980–2984, Nov. 1993.
Asamaki et al., "Copper self–sputtergn by planar magnetron", Japanese Journal of Applied physics, vol. 33, pt. 1, No. 8, 1994, pp. 2500–2503, May 1994.

*Primary Examiner*—Nam Nguyen
*Assistant Examiner*—Rodney G. McDonald
*Attorney, Agent, or Firm*—Charles S. Guenzer

[57] ABSTRACT

A plasma reactor for physical vapor deposition (PVD), also known as sputtering, which is adapted so that the atomic species sputtered from the target can self-sustain the plasma without the need of a working gas such as argon. The method is particularly useful for sputtering copper. According to the invention, a bias ring arranged around the wafer and rising above it is electrically biased to control the plasma potential, and hence to control the energy and directionality of the ions being sputter deposited on the wafer. The bias ring can be either a separate biasing element which can be positioned at a selected height above the wafer or a clamping ring clamping the wafer to the pedestal but having a biasing surface electrically insulated from the wafer and the pedestal.

10 Claims, 2 Drawing Sheets

5,897,752

WAFER BIAS RING IN A SUSTAINED SELF-SPUTTERING REACTOR

FIELD OF THE INVENTION

The invention relates generally to plasma processing of workpieces such as semiconductor integrated circuits. In particular, the invention relates to the physical vapor deposition (PVD) with sustained self-sputtering.

BACKGROUND ART

A critical part of any advanced semiconductor integrated circuit involves the one or more metallization levels used to contact and interconnect the active semiconductor areas, themselves usually residing in a fairly well defined crystalline silicon substrate. Although it is possible to interconnect a few transistors or other semiconductor devices, such as memory capacitors, within the semiconductor level, the increasingly complex topology of multiple connected devices soon necessitates another level of interconnect. Typically, an active silicon layer with transistors and capacitors formed therein is overlaid with a dielectric layer, for example, silicon dioxide. Contact holes are etched through the dielectric layer to particular contacting areas of the silicon devices. A metal is filled into the contact holes and is also deposited on top of the dielectric layer to form horizontal interconnects between the silicon contacts and other electrical points. Such a process is referred to as metallization.

A single level of metallization may suffice for simple integrated circuits of small capacity. However, dense memory chips and especially complex logic devices require additional levels of metallization since a single level does not provide the required level of interconnection between active areas. Additional metallization levels are achieved by depositing over the previous metallized horizontal interconnects another level of dielectric and repeating the process of etching holes, now called vias, through the dielectric, filling the vias and overlaying the added dielectric layer with a metal, and defining the metal above the added dielectric as an additional wiring layer. Very advanced logic devices, for example, fifth-generation microprocessors, have five or more levels of metallization.

Conventionally, the metallized layers have been composed of aluminum or aluminum-based alloys additionally comprising at most a few percent of alloying elements such as copper and silicon. The metallization deposition has typically been accomplished by physical vapor deposition (PVD), also known as sputtering. A conventional PVD reactor 10 is illustrated schematically in cross section in FIG. 1, and the illustration is based upon the Endura PVD Reactor available from Applied Materials, Inc. of Santa Clara, Calif. The reactor 10 includes a vacuum chamber 12 sealed to a PVD target 14 composed of the material to be sputter deposited on a wafer 16 held on a heater pedestal 18. A shield 20 held within the chamber protects the chamber wall 12 from the sputtered material and provides the anode grounding plane. A selectable DC power supply 22 biases the target negatively to about −600 VDC with respect to the shield 20. Conventionally, the pedestal 18 and hence the wafer 16 is left electrically floating.

A gas source 24 of sputtering working gas, typically chemically inactive argon, supplies the working gas to the chamber through a mass flow controller 26. A vacuum system 28 maintains the chamber at a low pressure. Although the chamber can be held to a base pressure of about $10^{-7}$ Torr or even lower, the pressure of the working gas is typically kept between about 1 and 1000 mTorr. A computer-based controller 30 controls the reactor including the DC power supply 22 and the mass flow controller 26.

When the argon is admitted into the chamber, the DC voltage ignites the argon into a plasma, and the positively charged argon ions are attracted to the negatively charged target 14. The ions strike the target 14 at a substantial energy and cause target atoms or atomic clusters to be sputtered from the target 14. Some of the target particles strike the wafer 16 and are thereby deposited on it, thereby forming a film of the target material.

To provide efficient sputtering, a magnetron 32 is positioned in back of the target 14. It has opposed magnets 34, 36 creating a magnetic field within the chamber in the neighborhood of the magnets 34, 36. The magnetic field traps electrons, and, for charge neutrality, the ion density also increases to form a high-density plasma region 38 within the chamber adjacent to the magnetron 32.

With the continuing miniaturization of integrated circuits, the demands upon the metallization have increased. Many now believe that aluminum metallization should be replaced by copper metallization. Murarka et al. provide a comprehensive review article on copper metallization in "Copper metallization for ULSI and beyond," *Critical Reviews in Solid State and Materials Science*, vol. 10, no. 2, 1995, pp. 87–124. Copper offers a number of advantages. Its bulk resistivity is less than that of aluminum, 1.67 $\mu$-$\Omega$cm vs. 2.7 $\mu\Omega$-cm for pure material, and any reduction in resistivity offers significant advantages as the widths and thicknesses of the metallization interconnects continue to decrease. Furthermore, a continuing problem with aluminum metallization is the tendency of aluminum atoms in an aluminum interconnect carrying a high current density to migrate along the interconnect, especially away from hot spots, in a process called electromigration. Any excessive amount of such migration will break an aluminum interconnect and destroy the integrated circuit. Copper-based alloys exhibit significantly reduced levels of electromigration.

Copper metallization is an unproven technology and is acknowledged to entail difficulties not experienced with the conventional aluminum metallization. However, it may afford ways to circumvent problems inherent in aluminum metallization.

One problem inherent in conventional sputtering is that it is performed in a fairly high pressure of the inert working gas, such as argon. However, the argon environment presents two problems. First, it is inevitable that some argon ions are deposited on the substrate and incorporated into the sputter deposited aluminum. Although the effect of these usually inactive argon ions is not precisely known, it is estimated that they reduce the conductivity of the sputter deposited aluminum by 50%.

Sputtering to fill holes relies at least in part on the sputtered particles being ballistically transported from the target to the wafer, that is, without scattering from the initial course. The ballistic trajectories allow the sputtered particles to arrive at the wafer nearly perpendicularly to the wafer's surface and thus to deeply penetrate into any aperture. However, the typical sputtering process is performed in an argon ambient of from 1 to 100 mTorr. Such a high pressure means that there is a significant probability that the aluminum sputter particles will collide with the argon atoms and thus be deflected from their ballistic paths. Accordingly, low-pressure sputtering is believed to provide better hole filling for deep vias. However, low pressure is generally equated with low deposition rates so that reducing the pressure is not a favored method for better directionality. Furthermore, a minimum pressure of about 0.2 mTorr is required to support a plasma in the usual configuration of FIG. 1.

High-density plasma (HDP) sputter reactors are being actively developed and are approaching commercialization. One of the advantages of HDP sputtering is that a sizable fraction of the sputtered particles are ionized during their travel toward the substrate. Then, the pedestal supporting the wafer can be selectively biased by an RF source to create a DC self-bias with respect to the positively charged plasma. As a result, the wafer can be biased negatively with respect to the plasma (−20 V being a typical value), and the positively charged sputtered ions are accelerated from the generally neutral plasma toward the substrate. The added velocity provides a highly directional flux normal to the plane of the substrate, thus reaching deeply into holes of high aspect ratios. Nulman in European Patent Publication 703,598-A1 discloses inserting a negatively biased grid between the substrate and the HDP source using argon working gas.

There has been much recent interest in the PVD deposition of copper films using sustained self-sputtering (SSS), for example, as disclosed by Posadowski et al. in "Sustained self-sputtering using a direct current magnetron source," *Journal of Vacuum Science and Technology, A*, vol. 11, no. 6, 1993, pp. 2980–2984. No working gas is used in sustained self-sputtering, at least after the plasma has been ignited. Instead, a sufficient number of the atoms sputtered from the target are ionized and then attracted back to the target at sufficiently high energy to serve as the sputtering ions in place of the more typical argon ions.

The condition for achieving self-sustained sputtering, which is observed only with some target materials under special conditions, may be expressed as $$\alpha \cdot \beta \cdot S_m = 1, \quad (1)$$

where $\alpha$ is the ionization fraction of the atoms sputtered from the target, $\beta$ is the ratio of sputtered atoms that return to the target, and $S_m$ is the self-sputtering yield, that is, the number of copper atoms in the case of a copper target that are sputtered from the target by one returning copper atom. The ionization fraction and the return ratio depend upon both the material and the current density, as well as other operating conditions, but the two factors are necessarily less than unity. Generally the product $\alpha\beta$ increases at high current density. Hence, a large value of the self-sputtering yield is crucial for sustained self-sputtering, and a high current density is also important. The conventional metallization material Al and other metals used with Al hole filling, viz., Ti, Mo, W, and Ta, have sub-unity self-sputtering yields, thus precluding their use in sustained self-sputtering. However, Cu has an acceptable value of self-sputtering, as do Pd, Pt, Ag, and Au.

One of the advantages of self-sustained sputtering is the high ionization fraction of the sputtered particles. In sustained self-sputtering for wafers of larger size, the pedestal needs to be grounded to act as the anode, and it thus attracts the ionized sputtered particles to the wafer. Also, the potential inside the plasma, typically a fairly constant value $V_p$ believed to be in the neighborhood of 20V, is always positive so that the ionized particles are accelerated across the plasma sheath to the grounded pedestal and wafer. The added velocity normal to the wafer plane facilitates filling of deep holes.

Asamaki et al. have reported the SST deposition of copper in "Copper self-sputtering by planar magnetron," *Japanese Journal of Applied Physics*, vol. 33, pt. 1, no. 5A, 1994, pp. 2500–2503 and in "Filling of sub-μm through holes by self-sputter deposition," *Japanese Journal of Applied Physics*, vol. 33, pt. 1, no. 8, 1994, pp. 4566–4569. They reported in the last reference very good bottom coverage in 0.4 μm holes having aspect ratios of about 3.

However, the known SSS work has been of an experimental nature and several difficult problems need to be addressed before sustained self-sputtering can be commercialized for the mass integrated circuit market.

Self-sustained sputtering, while offering several advantages, has some inherent drawbacks that have not been adequately addressed. In a more conventional sputtering reactor, the argon working pressure and the plasma density can be varied to control the sputtering. In HDP sputtering, the plasma power can be decoupled from the target power by inductively coupling power into the plasma. Thereby, the ionization fraction of sputtered particles can be controlled by the plasma density while the plasma sheath voltage can be separately controlled, thus controlling the directionality of sputtered ions incident on the wafer. In self-sustained sputtering, the target power needs to be maximized to achieve SSS in the high-density plasma region. While a high fraction of the sputtered particles are ionized, the control of the sheath voltage is not easily controlled and the pressure of the working gas is effectively too low to have much effect. In sustained self-sputtering for larger wafers, the wafer is grounded so that it cannot be further biased to control the velocity of sputtered ions incident upon it, a well known technique for deep hole filling.

Accordingly, it is desired to provide more control of the plasma in sustained self-sputtering. Also, it is desired to provide more control of the energy and directionality of the sputtered ion as it approaches the substrate being sputter deposited in sustained self-sputtering.

SUMMARY OF THE INVENTION

A self-sustained sputtering plasma reactor, particularly applicable to sputtering copper, in which a bias ring is positioned around and preferably above the substrate being sputtered deposited to control the potential of the plasma, and thus control the sheath voltage and the energy and directionality of the sputtered ions incident upon the substrate.

DETAILED DESCRIPTION OF THE PREFERRED EMBODIMENTS

Figure 1:
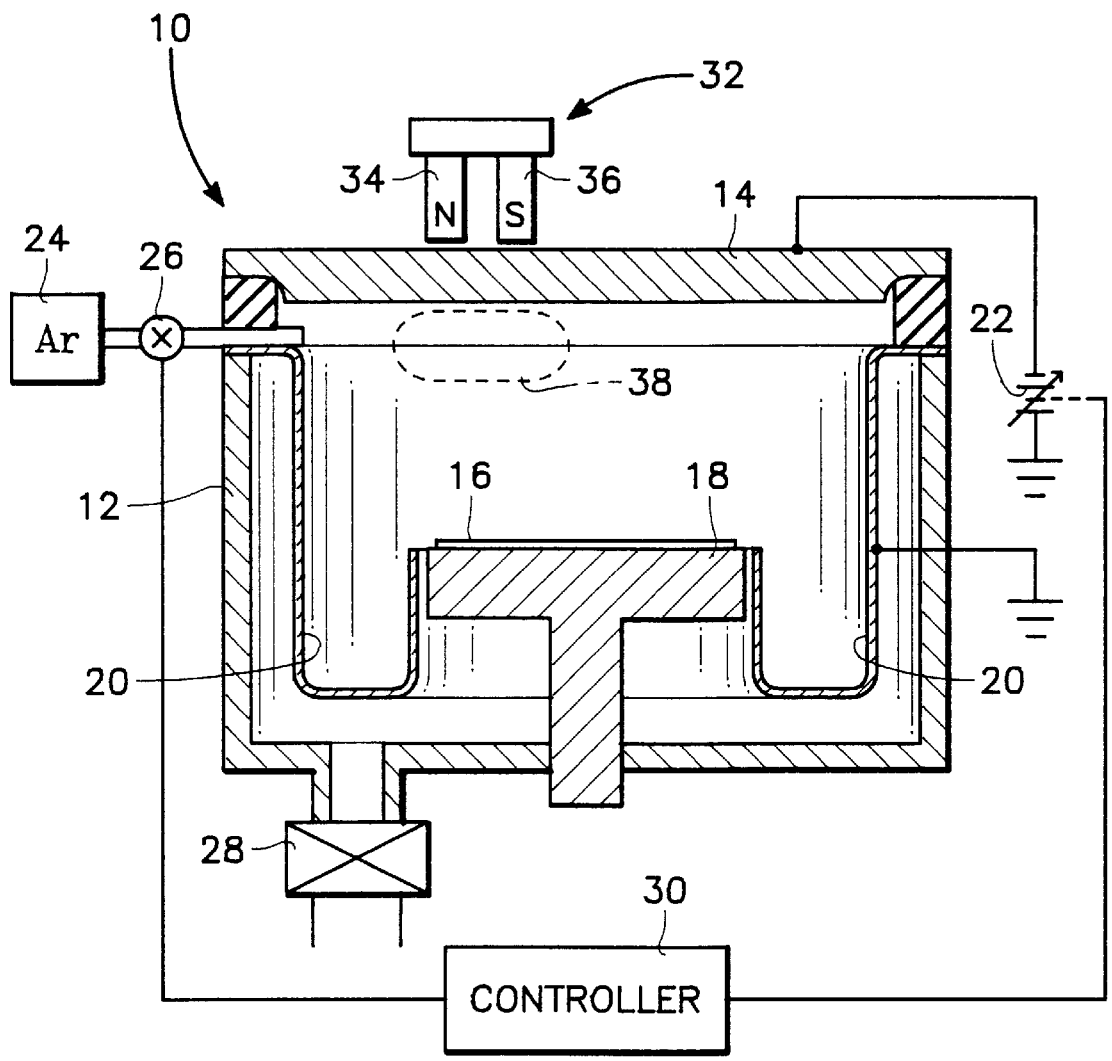
FIG. 1 is a schematic cross-sectional view of a conventional PVD reactor.
Figure 2:
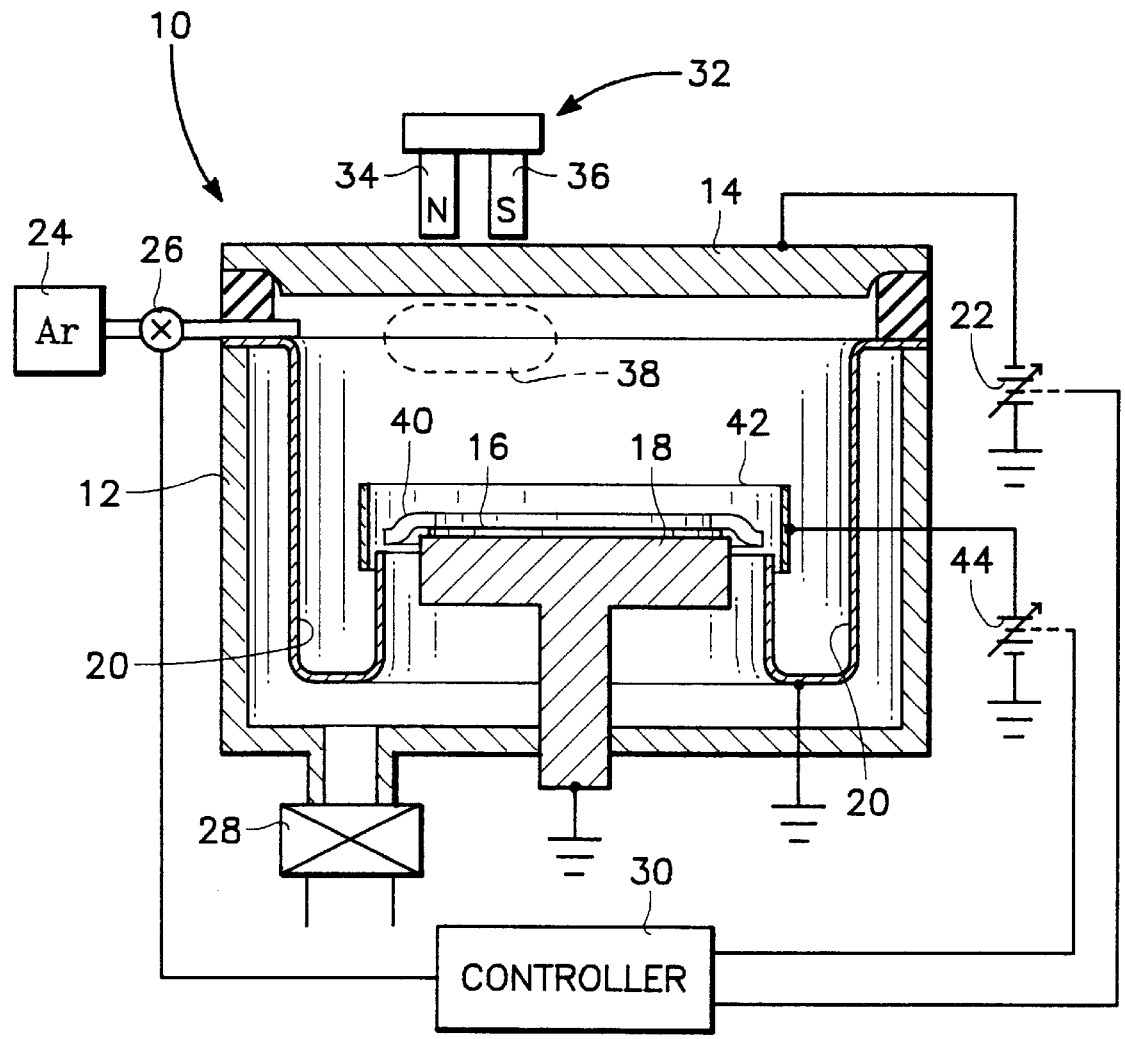
FIG. 2 is a schematic cross-sectional view of an embodiment of a PVD reactor according to the invention.

An embodiment of the invention is illustrated in FIG. 2. For self-sustained sputtering, argon is admitted into the chamber 12 to ignite the plasma, but, once it is ignited, the argon pressure is substantially reduced and the high-density plasma region 38 is sustained by the copper ions sputtered from the target 14. Also, in this embodiment, the pedestal 18 is AC and DC grounded. Typically, a metal clamp ring 40 holds the wafer 16 against the pedestal 18 and is also used to shield the periphery of the wafer 16 from sputter deposition. The clamp ring 40 extends only a few millimeters above the top surface of the wafer 16 and, in this embodiment, is held at the potential of the pedestal. The clamp ring 40 is typically made of stainless steel, a moderate electrical conductor, although for titanium sputtering it is more often made of titanium.

According to this embodiment of the invention, a bias ring 42 is positioned around the wafer 16 and clamp ring 40. Preferably, it has a tubular, generally cylindrical shape, and it composed of high-purity, high-conductivity copper to minimize contaminants. The bias ring 42 is located within the shield 20 but is electrically isolated from it. A second variable DC power supply 44 variably biases the bias ring 42, typically to a few tenths of a volt positive with respect to the shield 20 and to the pedestal 18 or to any other electrically biased portion of the chamber facing the plasma.

The biasing ring 42 is located radially outside the clamp ring 40 by a small distance, preferably a few millimeters to 1 or 2 cm. The close spacing maximizes the biasing effect of the bias ring 42 upon the potential above the wafer 16. The top of the bias ring 42 is located a few centimeters above the clamp ring 40 and the wafer 16. As a result, it interacts with the plasma above the wafer 16. The added electrical potential provided by the bias ring 42 operates to raise the plasma potential $V_p$ and hence to increase the sheath voltage adjacent to the grounded wafer 16. Expressed differently, it effectively negatively biases the wafer 16 with respect to the quasi-neutral portion of the plasma so as to accelerate the sputtered copper ions as they exit the plasma towards the wafer 16. The amount of effective negative bias can be adjusted by changing the adjustable DC power supply 44. However, it is believed that biasing voltages of about 20 VDC provide the type of control required for advanced hole filling. Furthermore, the height of the bias ring 42 can be adjusted by well known chamber mechanisms to optimize the deposition. However, if it is raised too high it will disturb the uniformity of the plasma.

Although the high-density region 38 of the plasma is crucial for sustained self-sputtering, the overall SSS plasma within the chamber 12 shares some characteristics with a conventional plasma of a working gas while differing in other characteristics. The conventional plasma is relatively cold, the argon ions having an energy of about 0.1 eV compared to an equilibrium, thermal energy of 0.026 eV at room temperature. In contrast, an SSS plasma is relatively hot since the atoms sputtered from the target have kinetic energies in the range of 1 to 10 eV, and subsequent ionization does not significantly change the energy. Of course, the electron temperature may still be much higher than that of the ions. The copper ions in the SSS plasma thus have a much higher energy, that is, form a hotter plasma. Nonetheless, as the copper ions ballistically travel to the wafer, they travel through a region that is quasi neutral since electrons are available to also fill the chamber. Thus, the entire region between the target and wafer can be characterized as a plasma, albeit a plasma that is not in thermal equilibrium. A plasma sheath and associated voltage drop necessarily form close to the wafer. The thickness of the plasma sheath is approximately inversely proportional to square root of the plasma density. This situation does not fundamentally differ from the conventional situation in which the plasma density is highest near the magnetron and drops off closer to the wafer. As a result, when the bias ring extends into the region occupied otherwise by the plasma and its sheath, applied bias will affect the plasma conditions, in particular raising the plasma potential. In a plasma, the electrons move much more quickly than the ions and deposit on any surface near the plasma. Thus, adjusting the potential of the adjacent surface will be reflected by the potential within the plasma.

For sustained self-sputtering, the pedestal must be grounded relative to the negatively biased target to act as the anode, and therefore also attract the large fraction of ionized copper ions while for conventional sputtering most of the target atoms are uncharged and ballistically travel to the wafer as well as to other chamber surfaces. For conventional HDP sputtering in which a high fraction of target atoms are ionized, usually by inductively coupled energy, the wafer can be independently biased to control the terminal velocity of the ionized sputtered atoms. According to the invention, the relative biasing of the target and wafer are used to sustain the self-sputtering plasma, and the bias ring controls the plasma potential and hence the terminal velocity of the ionized sputtered atoms. The planar geometry of the plasma excitation bias is more favorable than conventional anode grounding by means of the cylindrical shield. The electrical biasing of the bias ring can be done nearly independently of the plasma excitation.

Although the bias ring described above provides the optimum circumferential symmetry, it is not believed that a completely circular ring is required. A number of conductive pins extending longitudinally along the chamber axis above the wafer and arranged along the outline of a ring will similarly affect the plasma potential if the pins are equally biased. Even a minimum of three pins would provide fairly symmetric plasma biasing rings. However, the plasma biasing would be more effective if the separate biasing elements have a larger area, for example, equally biased electrode segments arranged in the shape of a circle with gaps between the segments.

Figure 3:
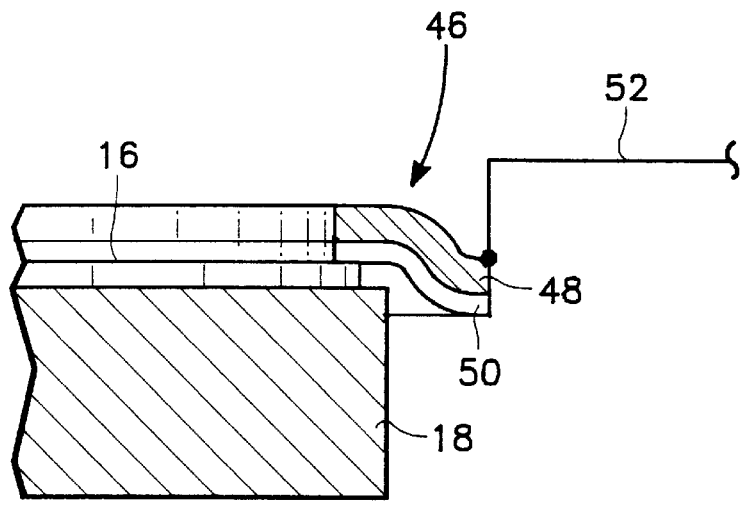
FIG. 3 is a cross-sectional view of a clamping ring used also as a bias ring.

In another embodiment of the invention, a separate bias ring is not required. Instead, the variable DC power supply is connected to the clamp ring 40. Additionally, the clamp ring is modified, as shown by clamp ring 46 in the cross-sectional view of FIG. 3, to have a metallic body 48 on its side facing the plasma and an insulating film 50 on its side touching the wafer 16 and pedestal 18. The DC power supply is connected to the metallic body 48 through an electrical line 52. Thereby, the clamp ring 46 can be biased independently of the wafer 16. Alternatively, the clamp ring can be formed principally of an insulating ceramic with a metallic film on its top surface, and the DC power supply is connected to the metallic film.

The invention thus provides a method and apparatus of controlling the sputtering characteristics in sustained self-sputter. In particular, electrical biasing can control the energy and directionality of the sputtered particles. This control is achieved with minimal influence upon the principal conditions of sustained self-sputtering.

What is claimed is:

1. A sputtering chamber, comprising:

a vacuum chamber;

a target inside said chamber and comprising a material to be sputtered;

an electrically conductive pedestal for holding a substrate to be sputter deposited with said material;

a magnet assembly disposed on a side of said target opposite said pedestal;

a first power supply biasing said target with respect to a fixed potential on said pedestal;

an electrically conductive bias ring surrounding an outside of said pedestal and rising above said pedestal towards said target, wherein said bias ring is adapted to clamp said substrate to said pedestal while remaining electrically isolated from said substrate and said pedestal; and a second power supply biasing said bias ring with respect to said pedestal.

2. The sputtering chamber of claim 1, wherein said material of said target to be sputter deposited comprises copper.

3. The sputtering chamber of claim 1, wherein said bias ring is made of copper.

4. The sputtering chamber of claim 1, wherein said first power supply sufficiently biases said target to cause ions of said material sputtered from said target to sustain a plasma in a region of said chamber adjacent to said magnet assembly.

5. A sustained self-sputtering reactor comprising:

a vacuum chamber;

a target of a material to be sputter deposited;

a pedestal for holding a substrate;

a magnetron assembly disposed on a back side of said target;

a first DC power supply connected between said target and said pedestal and capable of generating a sustained self-sputtering plasma comprising ions of said material in a vicinity of said target adjacent to said magnetron assembly;

a bias ring disposed around said pedestal and rising above said substrate only part ways towards said target; and a second DC power supply connected to said bias ring and biasing it relative to said pedestal;

wherein said bias ring additionally acts as a clamp ring for clamping said substrate to said pedestal without said substrate being biased by said second DC power supply.

6. The reactor of claim 5, wherein said material comprises copper.

7. A sustained self-sputtering reactor, comprising:

a vacuum chamber;

a target of a material to be sputter deposited;

a pedestal for holding a substrate;

a magnetron assembly disposed on a back side of said target;

a first DC power supply connected between said target and said pedestal and capable of generating a sustained self-sputtering plasma comprising ions of said material in a vicinity of said target adjacent to said magnetron assembly;

a bias ring disposed around said pedestal and rising above said substrate towards said target, wherein said bias ring additionally acts as a clamp ring for clamping said substrate to said pedestal; and a second DC power supply connected to said bias ring and biasing it relative to said pedestal;

wherein said clamp ring comprises an insulating portion facing said substrate and said pedestal and a conductive portion connected to said second DC power supply.

8. A method of sputtering depositing, comprising:

supporting a substrate on an electrically conductive pedestal within a vacuum chamber;

clamping said substrate to said pedestal with a conductive ring, said conductive ring disposed on a periphery of said pedestal and rising above said substrate and having an insulating portion facing said pedestal and said substrate so as to be electrically insulated therefrom;

admitting a working gas into said chamber;

biasing with respect to said pedestal a sputtering target facing said pedestal and comprising a material to ignite said working gas into a plasma, a magnet assembly being located on a backside of said target;

then decreasing a supply of said working gas into said chamber while continuing to bias said sputtering target sufficient to cause ions of said material to sustain a plasma in a region adjacent to said magnetron; and while said plasma is sustained, biasing said conductive ring with respect to said pedestal.

9. A method of sustained self-sputtering, comprising the steps of:

supporting a substrate on a pedestal within a vacuum chamber;

creating a magnetic field in a region adjacent to a face of a target facing an interior of said chamber, said face of said target comprising a material to be sputtered;

a first step of biasing said target to cause sustained self-sputtering of said material from said target;

a second step of biasing one or more electrically conductive members placed around said substrate and rising above a surface of said substrate towards said target, to thereby control ions of said material incident upon said substrate from a plasma existing between said target and said substrate; and clamping said substrate to said pedestal with said one or more members without thereby biasing said substrate from said second biasing step.

10. The method of claim 9, wherein said material to be sputtered comprises copper.

* * * * *